(12) United States Patent
Heude et al.

(10) Patent No.: US 11,373,928 B2
(45) Date of Patent: Jun. 28, 2022

(54) POWER UNIT, IN PARTICULAR FOR AN AIRCRAFT

(71) Applicant: Safran Electrical & Power, Blagnac (FR)

(72) Inventors: Sébastien Heude, Blagnac (FR); Jacques Salat, Blagnac (FR); Rémi Pochet, Blagnac (FR)

(73) Assignee: Safran Electrical & Power, Blagnac (FR)

( * ) Notice: Subject to any disclaimer, the term of this patent is extended or adjusted under 35 U.S.C. 154(b) by 16 days.

(21) Appl. No.: 16/981,161

(22) PCT Filed: Mar. 18, 2019

(86) PCT No.: PCT/FR2019/050601
§ 371 (c)(1),
(2) Date: Sep. 15, 2020

(87) PCT Pub. No.: WO2019/175522
PCT Pub. Date: Sep. 19, 2019

(65) Prior Publication Data
US 2021/0066165 A1    Mar. 4, 2021

(30) Foreign Application Priority Data

Mar. 16, 2018  (FR) ...................................... 1852258

(51) Int. Cl.
*H01L 23/467*   (2006.01)
*F28F 3/02*     (2006.01)

(52) U.S. Cl.
CPC .............. *H01L 23/467* (2013.01); *F28F 3/02* (2013.01)

(58) Field of Classification Search
CPC . H01L 23/467; H01L 23/473; H01L 23/4735; H01L 23/4012; F28F 3/02; F28F 3/022; F28F 3/025; F28F 9/22; H05K 7/2089; H05K 7/20909
See application file for complete search history.

(56) References Cited

U.S. PATENT DOCUMENTS 5,063,476 A  * 11/1991  Hamadah .............. H01L 23/467
                                             361/697
5,915,463 A    6/1999  Romero et al.
(Continued)

FOREIGN PATENT DOCUMENTS

DE   10 2016 200 724 A1   7/2017
JP      2009-182313 A     8/2009
(Continued)

*Primary Examiner* — Tho V Duong
(74) *Attorney, Agent, or Firm* — Blank Rome LLP

(57) ABSTRACT

A power assembly that has at least two power modules that each have at least one component to be cooled, for example, an electronic chip mounted on a base from which cooling elements extend. Each power module also has a hollow body with a channel for flow of a coolant fluid Each power module is mounted on each respective body so that the cooling elements extend at least partially into said channel through an opening of the body. At least one deflector is mounted in the channel between the cooling elements of the two modules so as to force the coolant fluid to flow in the zone of the channel comprising the cooling elements.

7 Claims, 3 Drawing Sheets

(56) References Cited

U.S. PATENT DOCUMENTS

| | | | |
|---|---|---|---|
| 8,120,914 B2* | 2/2012 | Kajiura | H01L 23/473 361/699 |
| 8,136,577 B2* | 3/2012 | Edward | H05K 7/20154 165/80.3 |
| 9,247,679 B2* | 1/2016 | Joshi | H05K 7/20927 |
| 2001/0014029 A1* | 8/2001 | Suzuki | H05K 7/20927 363/141 |
| 2008/0237847 A1* | 10/2008 | Nakanishi | H01L 23/473 257/722 |

FOREIGN PATENT DOCUMENTS

| | | |
|---|---|---|
| JP | 2016-225530 A | 12/2016 |
| WO | WO2013/065427 A1 | 5/2013 |
| WO | WO 2014/092655 A1 | 6/2014 |

* cited by examiner

POWER UNIT, IN PARTICULAR FOR AN AIRCRAFT

CROSS-REFERENCE TO RELATED APPLICATIONS

This application is a national phase of PCT/FR2019/050601, filed Mar. 18, 2019, which claims the benefit of French Patent Application No. 1852258, filed Mar. 16, 2018, the subject matter of each of which are incorporated by reference herein in their entirety.

FIELD OF THE INVENTION

The present invention relates to a power unit, in particular for an aircraft.

BACKGROUND OF THE INVENTION

A power module comprises electronic chips, for example made of silicon or silicon carbide (SiC) or gallium nitride (GaN), such as power transistors, in particular of the MOSFET type, insulated gate bipolar transistors (IGBT) or diodes. These chips tend to emit heat that needs to be dissipated since such chips have to operate within a defined temperature range. Such power modules can equip aircraft and be located in environments that are highly exposed to high heat, making it difficult to evacuate the heat produced by the power module. Such modules often need to be housed in a closed housing that is isolated from the cooling air flow. Moreover, the operating modes of such power modules are increasingly demanding, since it is necessary to be able to compensate for high power densities to be evacuated over long periods and/or high peaks of heat dissipation, spaced by short rest periods.

Document JP 2016-225530 discloses a power package comprising a power module with cooling chips mounted on a sole attached to the upper wall of a housing via a thermal interface. The thermal interface ensures good thermal contact between the sole and the upper wall by compensating for slight flatness deviations due to manufacturing tolerances. The housing delimits a channel with an inlet and an outlet for liquid coolant, the coolant circulating in said channel. Cylindrical pins extend from the upper wall of the housing into the channel to form heat exchange means.

During operation, the heat from the power module is transferred to the coolant via the thermal interface, the upper wall and the cylindrical pins.

Such cooling, however, has a reduced efficiency. Indeed, the thermal interface forms a thermal insulator, reducing heat exchanges between the power module sole and the upper wall of the housing. The presence of the upper wall also limits heat exchanges and increases the weight of the assembly. Finally, the use of a liquid fluid requires the integration of equipment such as a pump and piping, and the integration of sealing means. The use of cylindrical pins is, in practice, hardly compatible with the use of air for cooling.

SUMMARY OF THE INVENTION

The present invention aims to remedy these various constraints in a simple, reliable and inexpensive way.

For this purpose, it concerns a power unit comprising at least two power modules each comprising at least one component to be cooled, for example an electronic chip, mounted on a sole from which cooling elements extend, and a hollow body comprising a flow channel for a cooling fluid, each power module being mounted on said body so that the cooling elements extend at least partly into said channel through an opening in the body, at least one deflector being mounted in said channel between the cooling elements of the two modules so as to force the cooling fluid to flow into the area of the channel having the cooling elements.

The cooling elements and the sole form a single piece, so that heat can be dissipated directly, without having to pass through an insulating thermal interface. In addition, the presence of the deflector ensures that the entire air flow through the channel is used to cool the cooling elements of the modules. This improves the cooling performance of the power module. Moreover, the same body allows the simultaneous cooling of several modules, which allows to limit the weight of the whole unit.

The air velocity can be adapted to the shape and dimensions of the deflector.

The cooling elements can have flat fins or cooling pins, e.g. cylindrical or conical in shape. Of course any other form can be considered.

The cooling elements can extend over the entire height of the channel.

The body may consist of an upper wall, a lower wall and two side walls delimiting the channel between them.

The channel can be straight. The channel may have a first end forming an air inlet and a second end forming an air outlet.

The cooling elements can be parallel to each other and can be oriented in the direction of the channel.

The sole may have an upper part inserted into the body opening, with cooling elements extending from a lower part of the sole.

The sole may have an upper part forming a shoulder surrounding the lower part of the sole, with the upper part of the sole resting on the body.

In particular, the upper part of the sole can rest on the upper body wall.

The upper part of the sole can be fixed to the body, e.g. by screwing.

The upper wall may have a thinned zone, whose thickness corresponds approximately to the thickness of the lower part of the sole.

The local thinning of the upper wall further reduces the mass of the assembly.

The deflector can extend in the direction of the channel and has a rounded or profiled upstream end.

The term upstream is defined in relation to the direction of fluid through the channel.

The assembly may comprise at least one central deflector, arranged between the cooling elements of a first power module, on the one hand, and the cooling elements of a second power module, on the other hand, a first side deflector located between the cooling elements of the first power module and a first side edge of the channel, and a second side deflector located between the cooling elements of the second power module and a second side edge of the channel.

The first side deflector and the second side deflector may each be in the form of a deflection module of a single structure, the central deflector being composed of two adjacent deflection modules.

The same deflection module structure can thus be used to make all the deflectors in the assembly. The central deflector then consists of two deflection modules placed symmetrically to the channel axis and side by side. Likewise, the two deflection modules forming the side deflectors can be placed symmetrically to the channel axis.

In this case, the two ends of the deflection module can be rounded or profiled, each end may be upstream in relation to the direction of flow of the cooling fluid, depending on the orientation and location of the deflection module in the channel.

Each deflector can be screwed to the body. It can also be fixed by another process (riveting or gluing).

Each deflector can extend over the entire height of the channel.

The deflectors also help to strengthen the body structure, especially the thinner area of the upper wall.

The electronic component is for example a power transistor, e.g. a MOSFET, an IGBT (Insulated Gate Bipolar Transistor) or a diode.

The sole and cooling elements are made of aluminium or aluminium alloy, for example. They can also be made of another material depending on the specifications of the module.

The coolant is preferably air. Of course, a liquid heat transfer fluid or a two-phase fluid can also be used.

The unit is used, for example, to control an electronic actuator or motor.

The invention also relates to an aircraft comprising a power unit of the aforementioned type.

The invention furthermore relates to electronics used in an avionics application comprising a power unit of the aforementioned type.

The invention will be better understood and other details, characteristics and advantages of the invention will appear when reading the following description, which is given as a non-limiting example, with reference to the attached drawings.

DETAILED DESCRIPTION

Figure 1:
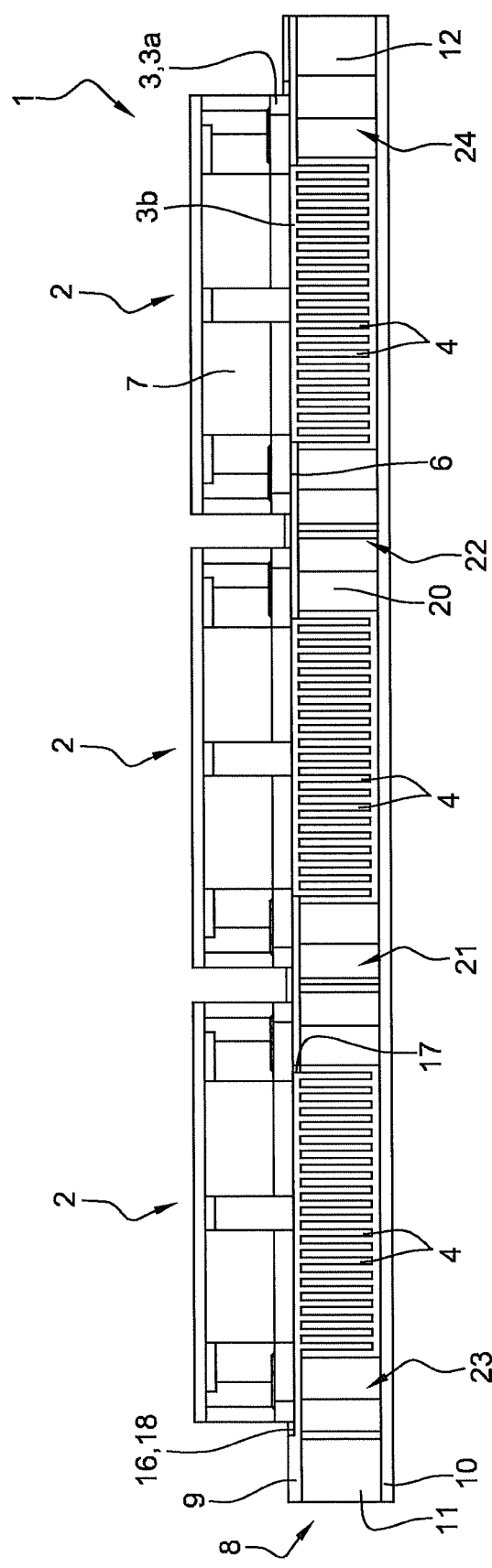
FIG. 1 is a front cross-section view of a power unit according to one embodiment of the invention.

FIGS. 1 to 6 illustrate a power unit 1 according to one embodiment of the invention. The power unit 1 comprises power modules 2, here three power modules 2, each comprising a sole 3 with a so-called upper part 3a and a so-called lower part 3b, better visible in FIG. 5. The terms upper and lower are defined relative to Figures. Of course, the power module 2 can actually be placed in different orientations.

Fins 4 extend from the lower part of sole 3, perpendicular to the plane of sole 3. Fins 4 are flat and are substantially parallel to each other. The number of fins 4 may vary depending on the width of the modules, the targeted performance, or the maximum targeted air speed. The fins increase the exchange surface by a factor varying between 1 and 50. They are distributed over the entire width of the module with a spacing adapted to the needs. Fins 4 are made of the same material as sole 3, these elements being made for example of aluminium. Base 3 has fixing holes 5 (FIG. 4), e.g. at the corners of sole 3.

The upper part 3a of the sole 3 forms a shoulder delimiting a peripheral bearing surface 6 (FIG. 5), surrounding the lower part 3b and the fins 4.

Power module 2 also includes electronic chips mounted on the sole 3 via an electrically insulating interface, which are not visible in the figures. These chips are for example power transistors, in particular of the MOSFET type, IGBTs (Insulated Gate Bipolar Transistor) or diodes. In addition, connection module 2 has connection means 7 for connecting said power module 2 to electrical cables.

Figure 6:
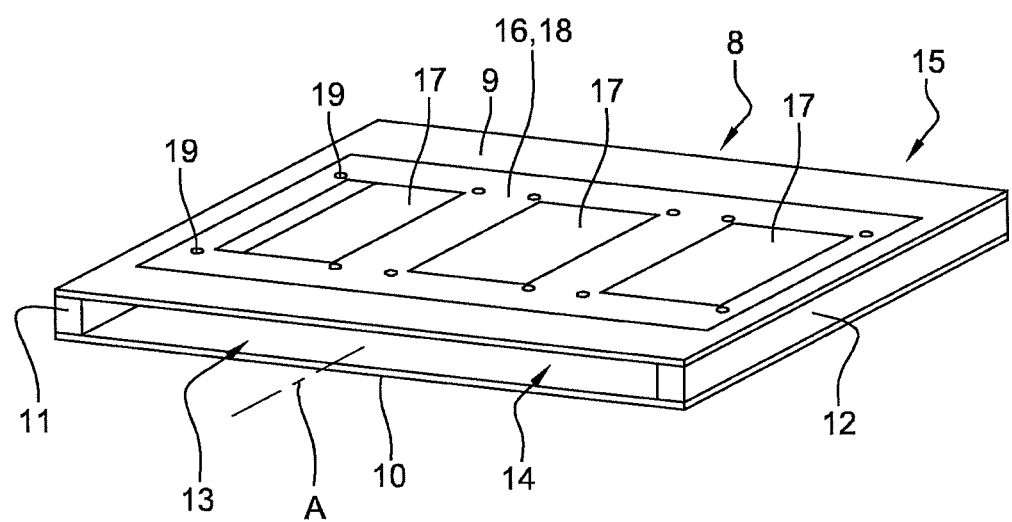
FIG. 6 is a perspective view of the body.

Furthermore, power unit 1 has a body 8, which is best seen in FIG. 6, comprising an upper wall 9, a lower wall 10, a first side wall 11 and a second side wall 12. Said walls 9, 10, 11, 12 are flat. The lower wall 10 and upper wall 9 are parallel to each other. The side walls 11, 12 are parallel to each other and perpendicular to the lower wall 10 and upper wall 9. Said walls 9, 10, 11, 12 delimit a channel 13 of rectangular cross-section, extending along an axis A, opening at a first end 14, intended to form an air inlet, and at a second end 15, intended to form an air outlet.

The upper wall 9 has a thinned zone 16. For example, thinned zone 16 is square or rectangular in shape. Said thinned zone 16 has for example a thickness between 0.5 mm and 3 mm. The remainder of the upper wall 9 has a thickness of, for example, 1 to 5 mm. The thickness of the lower part 3b of sole 3 is the same as the thickness of the thinned zone 16.

The thinned zone 16 has at least one opening 17, here three openings 17, opening into channel 13. Each opening 17 is square or rectangular in shape, complementary in shape to the lower part 3b of sole 3 so as to avoid a large surface discontinuity. Each module 2 is mounted on the body 8 in such a way that the bearing surface 6 of the upper part 3b of the sole 3 rests on the outer surface 18 of the thinned area 16 of the body 8. The lower part of the sole 3 is housed in the corresponding opening 17 of the thinned area 16 and the fins 4 extend completely into channel 13 of the body 8. The fins 4 are oriented parallel to the axis A of channel 13. Fins 4 extend on the full height of channel 13. Screws (not shown) are used to fix the sole 3 to the upper wall 9 of the body 8, said screws being inserted in holes 5 of the sole 3 and in holes 19 of the body 8.

The assembly 1 further comprises deflection modules 20 forming so-called central deflectors 21, 22 (see in particular FIG. 2), in particular a first central deflector 21 located between the fins 4 of a first module 2 and the fins 4 of a second module 2, and a second central deflector 22 located between the fins 4 of the second module and the fins 4 of a third module 2, and side deflectors 23, 24. A first lateral deflector 23 is located between the fins 4 of the first module 2 and the first side wall 11. A second lateral deflector 24 is located between the fins 4 of the third module 2 and the second side wall 12. The deflectors 21, 22, 23, 24 are made up of deflection modules 20 of the same structure. Each deflection module 20 extends along the axis A of the body 8, has a first side edge 25 intended to be in contact with air, and a second side edge 26. The first side edge 25 shall have a rounded, curved or profiled area 27 at each end. In addition, each deflection module 20 has a recessed area 28, e.g. opening at the second edge 26, which is located centrally between the two axial ends 27 of the deflection module 20.

Each central deflector 21, 22 is composed of two deflection modules 20 placed symmetrically with respect to the axis A of channel 13 and side by side so that the second side edges 26 of the two deflection modules 20 are adjacent. The two deflection modules 20 forming the side deflectors 23, 24 are positioned symmetrically with respect to the axis A of channel 13, so that the second side edges 26 of said deflection modules 20 are in contact with the corresponding side surfaces 11, 12. The deflection modules 20 extend over the entire height of channel 13, so as to completely obstruct the affected areas of channel 13.

The deflection modules 20 are attached to the body 8 with the screws also used to attach the base plates 3 of the power modules 2.

The deflectors 21, 22, 23, 24 help to strengthen the body 8 structure, especially the thinner area 16 of the upper wall 9.

Figure 2:
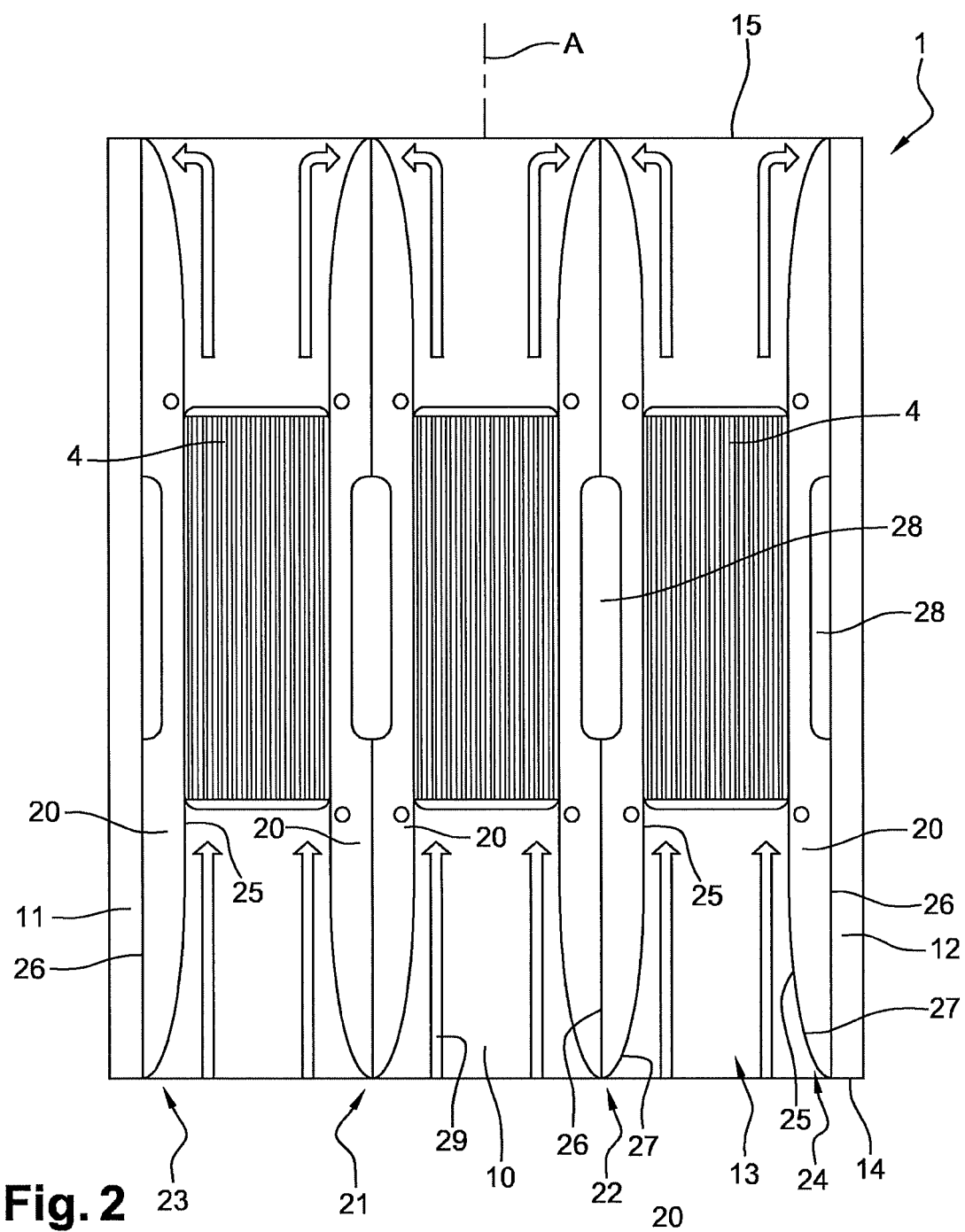
FIG. 2 is a top cross-section view of the power unit in FIG. 1.
Figure 3:
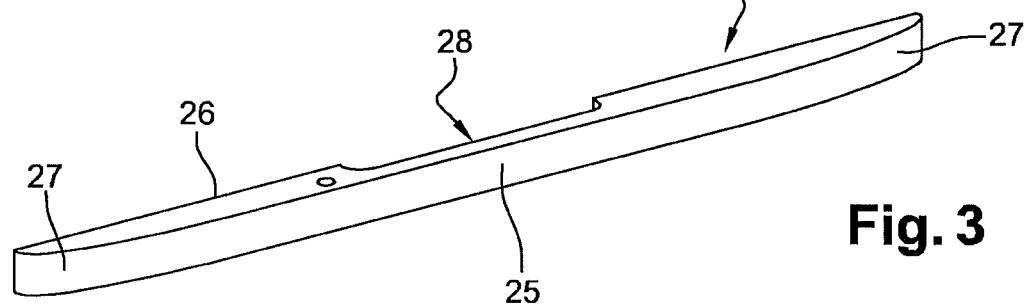
FIG. 3 is a perspective view of a deflection module used to form the deflectors.
Figure 4:
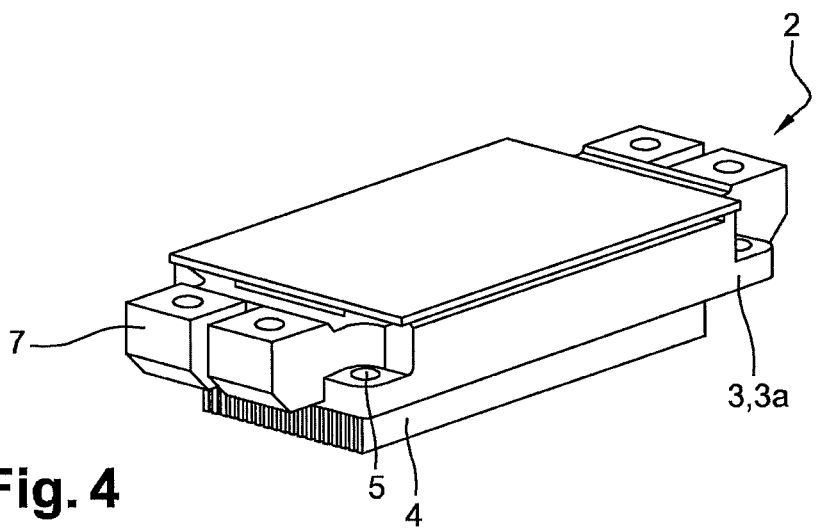
FIG. 4 is a perspective view of a power module.
Figure 5:
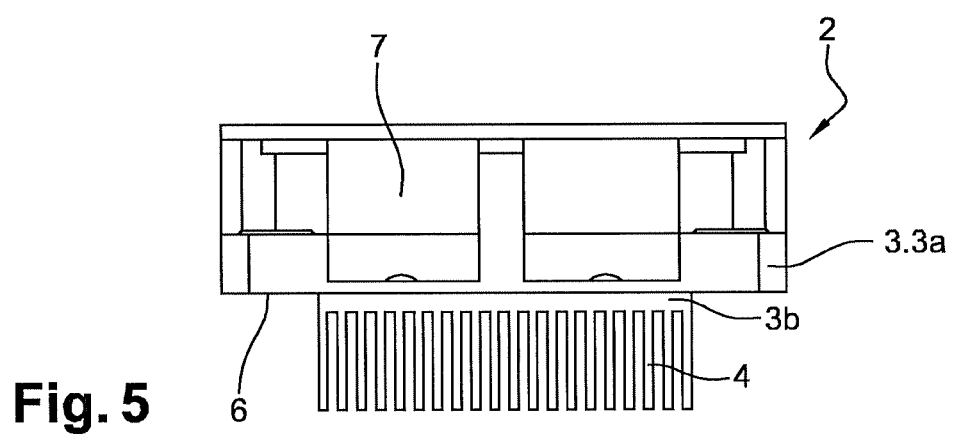
FIG. 5 is a front view of a power module.

During operation, cooling air 29 is introduced through the first end 14 of channel 13, or upstream end, and is homogeneously divided into three parts, each of which passes through the finned zones 4 of the individual power modules 2. The dimensions of the deflectors 21, 22, 23, 24 are determined so as to fill the gaps left either between the side walls 11, 12 of the body 8 and the zones of adjacent power modules 2 with the fins 4, or between the zones of adjacent power modules 2 with the fins 4, as is best seen in FIG. 2. This way, the deflectors 21, 22, 23, 24 force air 29 to pass through the different zones of channel 13 which are provided with fins 4, favouring the heat exchanges between said fins 4 and the cooling air 29 and thus the cooling of the power modules 2. Air 29 is then discharged from channel 13 through the second end 15, or downstream end.

The invention claimed is:

1. A power unit comprising at least two power modules each comprising:
   at least one component to be cooled, the at least one component comprising an electronic chip mounted on a sole from which cooling elements extend; and
   a hollow body comprising a flow channel for a cooling fluid,
   wherein each power module is mounted on said body so that the cooling elements extend at least partly into said channel through an opening in the body,
   wherein at least one deflector is mounted in said channel between the cooling elements of the two modules so as to force the cooling fluid to flow into the area of the channel having the cooling elements,
   wherein the body comprises an upper wall, a lower wall and two side walls delimiting the channel between them,
   wherein the at least one deflector comprises:
   at least one central deflector, arranged between the cooling elements of a first power module of the at least two power modules and the cooling elements of a second power module of the at least two power modules;
   a first side deflector arranged between the cooling elements of the first power module and a first side edge of the channel; and
   a second side deflector located between the cooling elements of the second power module and a second side edge of the channel, and
   wherein the first side deflector and the second side deflector are each in the form of a deflection module of a single structure, the central deflector being composed of two adjacent deflection modules.

2. The power unit according to claim 1, wherein the cooling elements are arranged parallel to one another and are oriented in the direction of the channel.

3. The power unit according to claim 1, wherein the sole has a lower part inserted into the opening of the body, the cooling elements extending from a lower part of the sole.

4. The power unit according to claim 3, wherein the sole comprises an upper part forming a shoulder surrounding the lower part of the sole, the upper part of the sole resting on the body.

5. The power unit according to claim 3, wherein the upper wall has a thinned zone having a thickness that is the same as a thickness of the lower part of the sole.

6. The power unit according to claim 1, wherein the at least one deflector extends in the direction of the channel and has a rounded or profiled upstream end.

7. Electronics used in an avionics application comprising a power unit according to claim 1.

* * * * *